United States Patent
Tarui

(10) Patent No.: US 9,748,393 B2
(45) Date of Patent: Aug. 29, 2017

(54) SILICON CARBIDE SEMICONDUCTOR DEVICE WITH A TRENCH

(71) Applicant: Mitsubishi Electric Corporation, Tokyo (JP)

(72) Inventor: Yoichiro Tarui, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 15/022,012

(22) PCT Filed: Oct. 17, 2013

(86) PCT No.: PCT/JP2013/078125
§ 371 (c)(1),
(2) Date: Mar. 15, 2016

(87) PCT Pub. No.: WO2015/056318
PCT Pub. Date: Apr. 23, 2015

(65) Prior Publication Data
US 2016/0225905 A1    Aug. 4, 2016

(51) Int. Cl.
*H01L 29/15* (2006.01)
*H01L 29/78* (2006.01)
(Continued)

(52) U.S. Cl.
CPC ........ *H01L 29/7853* (2013.01); *H01L 21/049* (2013.01); *H01L 29/0607* (2013.01);
(Continued)

(58) Field of Classification Search
CPC . H01L 29/0878; H01L 29/12; H01L 29/1608; H01L 29/41766; H01L 29/4236;
(Continued)

(56) References Cited

U.S. PATENT DOCUMENTS

| 5,907,169 A * | 5/1999 | Hshieh | H01L 21/28114 257/262 |
|---|---|---|---|
| 6,096,607 A | 8/2000 | Ueno | |
| 2012/0112266 A1* | 5/2012 | Tarui | H01L 23/544 257/329 |

FOREIGN PATENT DOCUMENTS

| JP | 11-068097 A | 3/1999 |
|---|---|---|
| JP | 2000-200907 A | 7/2000 |

(Continued)

OTHER PUBLICATIONS

An Office Action; "Notification of Reason for Refusal," issued by the Japanese Patent Office on May 10, 2016, which corresponds to Japanese Patent Application No. 2015-542445 and is related to U.S. Appl. No. 15/022,012; with English language partial translation.

(Continued)

*Primary Examiner* — Duy T Nguyen
(74) *Attorney, Agent, or Firm* — Studebaker & Brackett PC

(57) ABSTRACT

It is an object of the present invention to provide a silicon carbide semiconductor device that reduces a channel resistance and increases reliability of a gate insulating film. The present invention includes a trench partially formed in a surface layer of an epitaxial layer, a well layer formed along side surfaces and a bottom surface of the trench, a source region formed in a surface layer of the well layer on the bottom surface of the trench, a gate insulating film, and a gate electrode. The gate insulating film is formed along the side surfaces of the trench and has one end formed so as to reach the source region. The gate electrode is formed along the side surfaces of the trench and formed on the gate insulating film.

6 Claims, 8 Drawing Sheets

(51) Int. Cl.
| | |
|---|---|
| *H01L 21/04* | (2006.01) |
| *H01L 29/66* | (2006.01) |
| *H01L 29/16* | (2006.01) |
| *H01L 29/417* | (2006.01) |
| *H01L 29/423* | (2006.01) |
| *H01L 29/06* | (2006.01) |
| *H01L 29/12* | (2006.01) |
| *H01L 29/788* | (2006.01) |
| *H01L 29/08* | (2006.01) |

(52) U.S. Cl.
CPC ...... *H01L 29/0657* (2013.01); *H01L 29/0847* (2013.01); *H01L 29/12* (2013.01); *H01L 29/1608* (2013.01); *H01L 29/41766* (2013.01); *H01L 29/41775* (2013.01); *H01L 29/4236* (2013.01); *H01L 29/42364* (2013.01); *H01L 29/66068* (2013.01); *H01L 29/78* (2013.01); *H01L 29/788* (2013.01); *H01L 29/7813* (2013.01); *H01L 29/7851* (2013.01); *H01L 29/0878* (2013.01); *H01L 29/42368* (2013.01); *H01L 29/42376* (2013.01)

(58) Field of Classification Search
CPC ............... H01L 21/049; H01L 29/0607; H01L 29/0657; H01L 29/0847; H01L 29/41775; H01L 29/42364; H01L 29/42368; H01L 29/42376

See application file for complete search history.

(56) References Cited

FOREIGN PATENT DOCUMENTS

| | | |
|---|---|---|
| JP | 2008-112774 A | 5/2008 |
| JP | 2009-283692 A | 12/2009 |

OTHER PUBLICATIONS

International Search Report—PCT/JP2013/078125 mailed Jan. 21, 2014.

Notification of Transmittal of Translation of the International Preliminary Report on Patentability and Translation of Written Opinion of the International Searching Authority; PCT/JP2013/078125 issued on Apr. 28, 2016.

An Office Action; "Preliminary Rejection" issued by the Korean Patent Office on Mar. 28, 2017, which corresponds to Korean Patent Application No. 10-2016-7009871 and is related to U.S. Appl. No. 15/022,012; with English language translation.

* cited by examiner

SILICON CARBIDE SEMICONDUCTOR DEVICE WITH A TRENCH

TECHNICAL FIELD

The present invention relates to a silicon carbide semiconductor device, and more particularly, to a silicon carbide semiconductor device having improved performance including a channel resistance and reliability of a gate insulating film as compared to a planar metal-oxide-semiconductor field-effect transistor (MOSFET) and a trench MOSFET.

BACKGROUND ART

In conventional planar SiC-MOSFETs, a MOS channel is formed in a plane that is slightly tilted from a (0001) plane, and that is, for example, in a plane direction of the (0001) plane of a substrate on the market, more precisely, at an angle of four degrees off from the (0001) plane, so that a channel resistance is extremely increased. In trench SiC-MOSFETs used for solving the problem, the MOS channel is formed in a plane orthogonal to the (0001) plane, so that the trench SiC-MOSFETs have the merit of reducing the channel resistance more than that in the planar SiC-MOSFETs (see Patent Document 1).

PRIOR ART DOCUMENT

Patent Document

Patent Document 1: Japanese Patent Application Laid-Open No. 11-68097 (1999)

SUMMARY OF INVENTION

Problems to Be Solved by the Invention

However, in the trench SiC-MOSFETs, electric field strength applied to a gate insulating film on a bottom surface of a trench is increased, thereby reducing reliability of the gate insulating film.

The present invention has been made in view of the above mentioned problems, and an object thereof is to provide a silicon carbide semiconductor device capable of reducing a channel resistance and increasing reliability of a gate insulating film.

Means to Solve the Problems

A silicon carbide semiconductor device according to an aspect of the present invention includes: an epitaxial layer of a first conductivity type formed on a silicon carbide semiconductor substrate of the first conductivity type; a trench partially formed in a surface layer of the epitaxial layer; a well layer of a second conductivity type formed along side surfaces and a bottom surface of the trench; a source region of the first conductivity type formed in a surface layer of the well layer on the bottom surface of the trench; a gate insulating film that is formed along the side surfaces of the trench and has one end formed so as to reach the source region; a gate electrode formed along the side surfaces of the trench and formed on the gate insulating film; a source electrode formed over the source region; and a drain electrode formed on a back surface of the silicon carbide semiconductor substrate.

Effects of the Invention

According to the aspect of the present invention, the MOS channel is formed along the side surfaces of the trench, which can reduce the channel resistance. Moreover, the electric field strength applied to the gate insulating film can be suppressed, thereby increasing the reliability of the gate insulating film These and other objects, features, aspects and advantages of the present invention will become more apparent from the following detailed description of the present invention when taken in conjunction with the accompanying drawings.

DESCRIPTION OF EMBODIMENTS

Hereinafter, embodiments are described with reference to the accompanying diagrams.

In addition, words such as side surfaces and a bottom surface are used in this embodiment. The words are used to identify each surface for the sake of convenience and are not related with actual vertical and horizontal directions.

Figure 16:
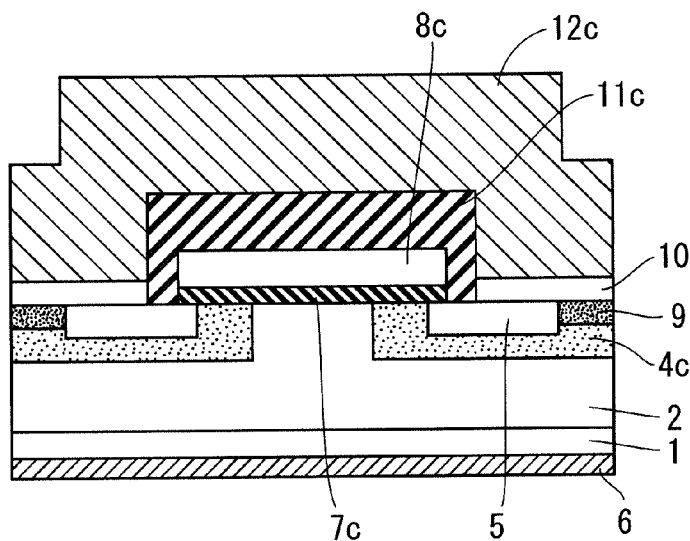
FIG. 16 is a diagram showing a cross-sectional structure of a silicon carbide semiconductor device in an underlying technology.
Figure 17:
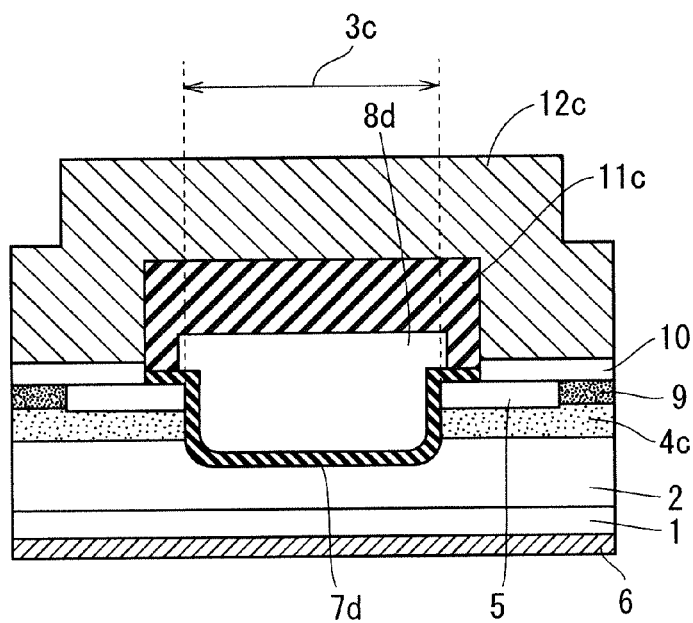
FIG. 17 is a diagram showing a cross-sectional structure of a silicon carbide semiconductor device in an underlying technology.

FIG. 16 and FIG. 17 are diagrams showing cross-sectional structures of silicon carbide semiconductor devices in underlying technologies.

As shown in FIG. 16, a planar silicon carbide semiconductor device in the underlying technology includes a silicon carbide semiconductor substrate 1 of an $n^+$-type and an epitaxial layer 2 of $n^-$ silicon carbide epitaxially grown on the silicon carbide semiconductor substrate 1 of the $n^+$-type.

A plurality of well layers 4c of a p-type are formed in a surface layer of the epitaxial layer 2. Source regions 5 and contact regions 9 of the p-type are partially formed in surface layers of the well layers 4c. The contact regions 9 are formed so as to be surrounded by the source regions 5 in plan view. Further, a silicide film 10 is formed so as to cover part of the source regions 5 and the contact regions 9. The silicide film 10 is made of NiSi, for example. This configuration is a configuration for forming an ohmic contact, and a carbide film, for example, is applicable except for the silicide film.

A gate electrode 8c (Poly-Si) is formed on the well layers 4c on which the silicide film 10 is not formed and formed on the source regions 5 on which the silicide film 10 is not formed with a gate oxide film 7c therebetween. The gate oxide film 7c and the gate electrode 8c are formed so as to reach another well layer 4c.

Then, an interlayer insulating film 11c is formed so as to cover the gate oxide film 7c, the gate electrode 8c, and the source regions 5 that are not covered with the silicide film 10. Further, a source electrode 12c is formed so as to cover the silicide film 10 and the interlayer insulating film 11c.

Moreover, a drain electrode 6 is formed on a back surface side of the silicon carbide semiconductor substrate 1.

MOS channels are formed in the well layers 4c below the gate oxide film 7c by application of voltage to the gate electrode 8c. However, the MOS channels are formed in a plane direction of a (0001) plane, which increases a channel resistance.

As shown in FIG. 17, a trench silicon carbide semiconductor device in the underlying technology includes a silicon carbide semiconductor substrate 1 of the $n^+$-type and an epitaxial layer 2 of the $n^-$ silicon carbide epitaxially grown on the silicon carbide semiconductor substrate 1 of the $n^+$-type, and a trench 3c is formed in a surface layer of the epitaxial layer 2.

A well layer 4c of the p-type is formed in the surface layer of the epitaxial layer 2 such that the trench 3c is sandwiched in the well layer 4c. A source region 5 and a contact region 9 of the p-type are formed in a surface layer of the well layer 4c. The contact region 9 is formed so as to be surrounded by the source region 5 in plan view. Further, a silicide film 10 is formed so as to cover part of the source region 5 and the contact region 9. The silicide film 10 is made of NiSi, for example.

A gate oxide film 7d is formed along side surfaces of the trench 3c, and the gate oxide film 7d covers part of the source region 5 in the surface layer of the epitaxial layer 2. Further, the trench 3c is filled with a gate electrode 8d (Poly-Si) with the gate oxide film 7d therebetween.

Then, an interlayer insulating film 11c is formed so as to cover the gate oxide film 7d, the gate electrode 8d, and the source region 5 that is not covered with the silicide film 10. Further, a source electrode 12c is formed so as to cover the silicide film 10 and the interlayer insulating film 11c.

Moreover, a drain electrode 6 is formed on a back surface side of the silicon carbide semiconductor substrate 1.

A MOS channel is formed in a plane orthogonal to the (0001) plane in the side surfaces of the trench 3c by application of voltage to the gate electrode 8d. However, electric field strength applied to the gate oxide film on the bottom surface of the trench is increased, which reduces reliability of the gate oxide film.

The embodiments described below are related to silicon carbide semiconductor devices that solve the problems above.

<First Embodiment>
<Configuration>

Figure 1:
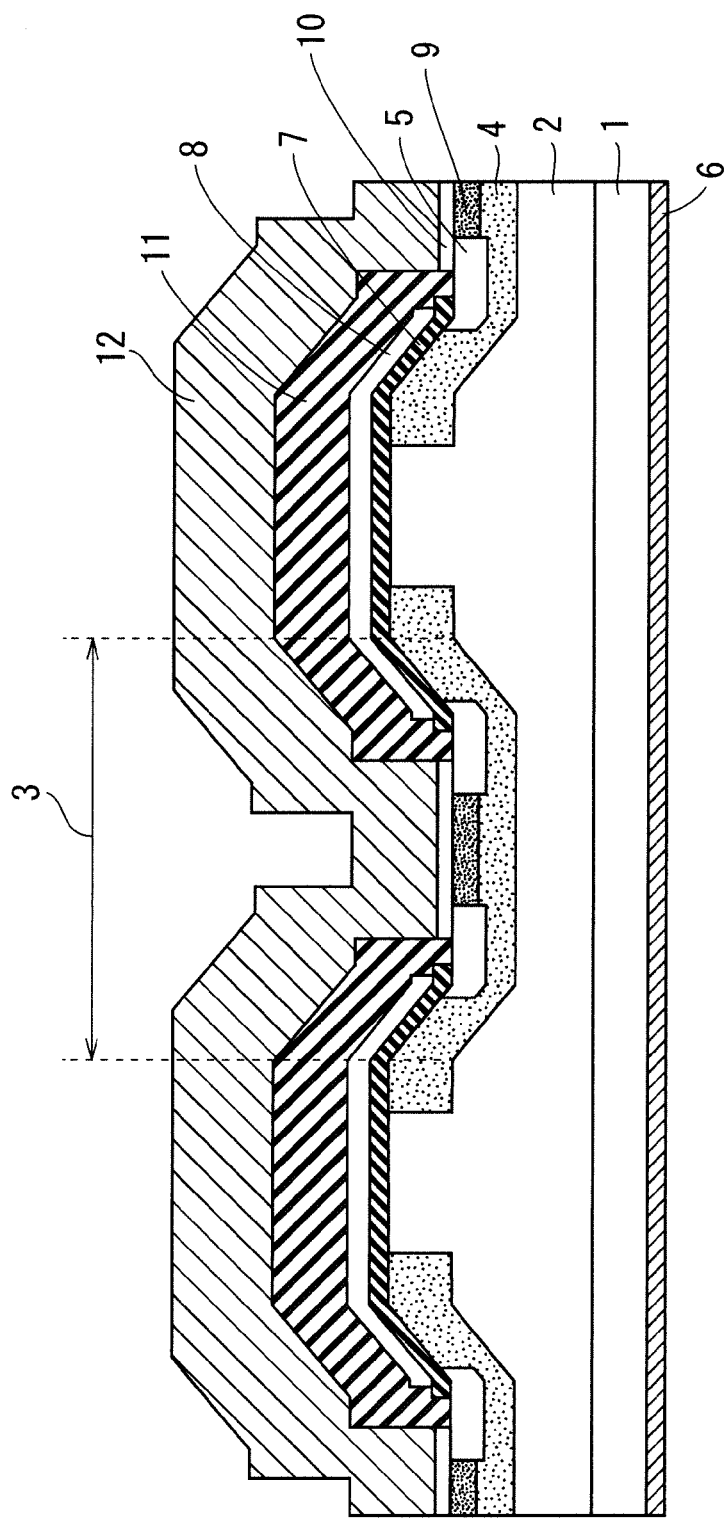
FIG. 1 is a diagram showing a cross-sectional structure of a silicon carbide semiconductor device in an embodiment.

FIG. 1 is a diagram showing a cross-sectional structure of a silicon carbide semiconductor device in this embodiment of the present invention. FIG. 1 particularly shows two unit cells in a region (active region) through which current of the silicon carbide semiconductor device flows. An actual silicon carbide semiconductor device has a structure in which a plurality of the unit cells shown in FIG. 1 are repeatedly disposed in a horizontal direction and connected in parallel. A structure (termination structure) for relieving electric fields in a termination region is located around the active region, but it is not shown herein.

Herein, the above-mentioned silicon carbide (SiC) is a type of wide gap semiconductors. The wide gap semiconductors are typically semiconductors having a band gap of approximately 2 eV or more, and, for example, a group III nitride typified by gallium nitride (GaN), a group II oxide typified by zinc oxide (ZnO), a group II chalcogenide typified by zinc selenide (ZnSe), and silicon carbide are known as the wide gap semiconductors. Silicon carbide is used, which is described in this embodiment, and the other wide gap semiconductors are similarly applicable.

As shown in FIG. 1, a silicon carbide semiconductor device in this embodiment includes a silicon carbide semiconductor substrate 1 of an $n^+$-type and an epitaxial layer 2 of $n^-$ silicon carbide epitaxially grown on the silicon carbide semiconductor substrate 1 of the $n^+$-type, and a trench 3 is partially formed in a surface layer of the epitaxial layer 2. The trench 3 shown in FIG. 1 has side surfaces having an angle of inclination with respect to the surface of the epitaxial layer 2, and the trench 3 has a larger width at a shallower depth of the trench 3.

A well layer 4 of a p-type is formed in the surface layer of the epitaxial layer 2 in which the trench 3 is formed. In other words, the well layer 4 is formed along a bottom surface and the side surfaces of the trench 3. The well layer 4 may be formed in a region (trench non-forming region) in which the trench 3 is not formed in the surface layer of the epitaxial layer 2. For the case shown in FIG. 1, the well layer 4 is formed so as to reach the trench non-forming region.

A source region 5 and a contact region 9 of the p-type are partially formed in a surface layer of the well layer 4. The contact region 9 is formed so as to be surrounded by the source region 5 in plan view. Further, a silicide film 10 is formed so as to cover part of the source region 5 and the contact region 9. The silicide film 10 is made of NiSi, for example. The source region 5, the contact region 9, and the silicide film 10 are formed on the bottom surface of the trench 3.

A gate electrode 8 (Poly-Si) is formed over the well layer 4 with a gate oxide film 7 therebetween, the well layer 4 being formed along the side surfaces of the trench 3.

One end of the gate oxide film 7 and one end of the gate electrode 8 are formed so as to reach the source region 5. The gate oxide film 7 and the gate electrode 8 may be formed in the trench non-forming region. For the case shown in FIG. 1, the gate oxide film 7 and the gate electrode 8 are also formed on the well layer 4 in the trench non-forming region.

Then, an interlayer insulating film 11 is formed so as to cover the gate oxide film 7, the gate electrode 8, and the source region 5 that is not covered with the silicide film 10. Further, a source electrode 12 is formed so as to cover the silicide film 10 and the interlayer insulating film 11.

Moreover, a drain electrode 6 is formed on a back surface side of the silicon carbide semiconductor substrate 1.

A MOS channel is formed in the side surfaces of the trench 3 by application of voltage to the gate electrode 8. The MOS channel is formed along the side surfaces of the trench 3, which can reduce a channel resistance more than that in the planar MOSFET. Furthermore, electric field strength applied to the gate oxide film 7 can be suppressed more than that in the trench MOSFET, which increases reliability of the gate oxide film 7.

<Manufacturing Method>

FIGS. 11 to 15 are diagrams showing steps of manufacturing the silicon carbide semiconductor device in the embodiment. With reference to the diagrams, a method for manufacturing the silicon carbide semiconductor device in the embodiment is described below.

Figure 11:
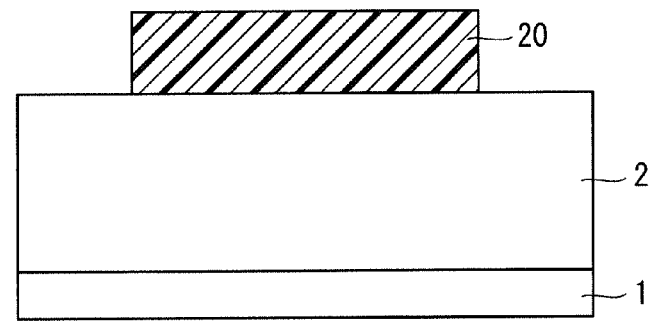
FIG. 11 is a diagram showing a step of manufacturing the silicon carbide semiconductor device in the embodiment.

First, as shown in FIG. 11, the epitaxial layer 2 of the n⁻ silicon carbide is epitaxially grown on the silicon carbide semiconductor substrate 1 of the n⁺-type. Further, a resist 20 is formed on a partial area of the epitaxial layer 2 of the n⁻ silicon carbide.

Figure 12:
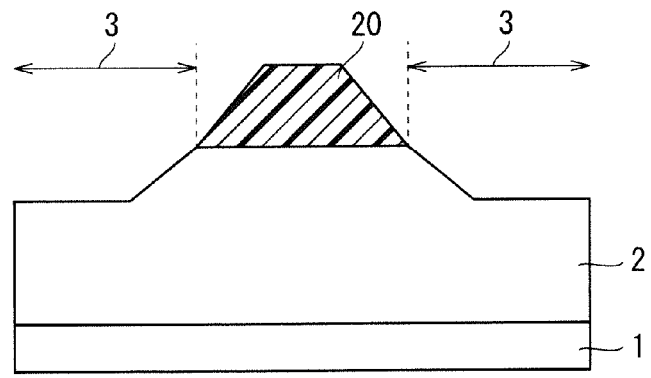
FIG. 12 is a diagram showing a step of manufacturing the silicon carbide semiconductor device in the embodiment.

Next, as shown in FIG. 12, the trench 3 is formed by dry etching. In this case, a selection ratio of the resist 20 to the epitaxial layer 2 is set to approximately 1:1, which allows the trench 3 having a tapered shape to be formed as shown in FIG. 12. A tapered angle of the trench 3 can be adjusted by the selection ratio of the resist 20 to the epitaxial layer 2.

Figure 13:
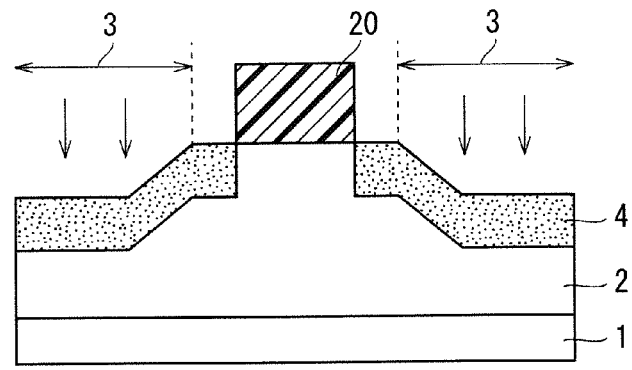
FIG. 13 is a diagram showing a step of manufacturing the silicon carbide semiconductor device in the embodiment.

Next, as shown in FIG. 13, an Al ion implantation is performed to form the well layer 4 of the p-type.

Figure 14:
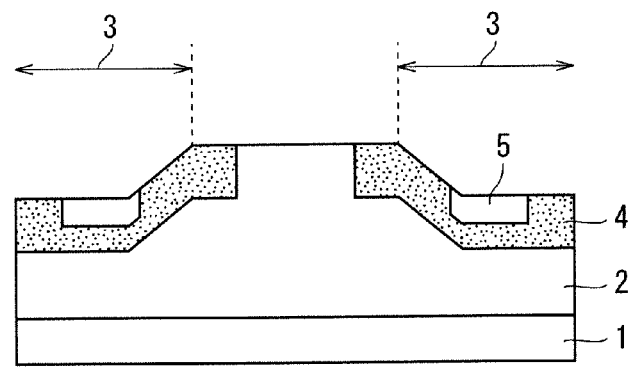
FIG. 14 is a diagram showing a step of manufacturing the silicon carbide semiconductor device in the embodiment.

Next, as shown in FIG. 14, a selective ion implantation is performed similarly to the case in which the well layer 4 is formed, to thereby form the source region 5.

Figure 15:
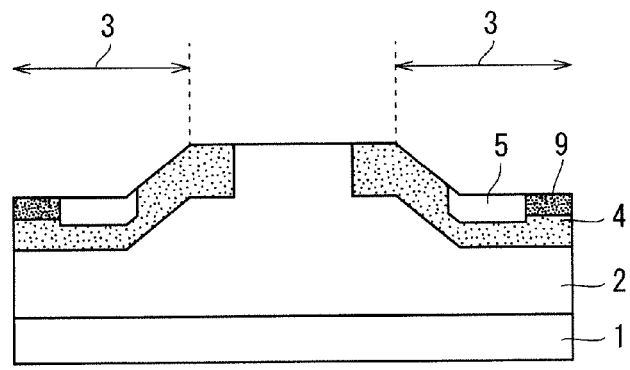
FIG. 15 is a diagram showing a step of manufacturing the silicon carbide semiconductor device in the embodiment.

Next, as shown in FIG. 15, the selective ion implantation is performed similarly to the case in which the well layer 4 is formed, to thereby form the contact region 9 of the p-type.

Further, the gate oxide film 7 and the gate electrode 8 are formed so as to reach the trench 3, and the interlayer insulating film 11 is formed so as to cover the gate electrode 8. The silicide film 10 is formed in the position so as to cover part of the source region 5 and the contact region 9, and the source electrode 12 is formed so as to cover the interlayer insulating film 11 and the silicide film 10.

Meanwhile, the drain electrode 6 is formed on the back surface of the silicon carbide semiconductor substrate 1.

The silicon carbide semiconductor device in this embodiment can be manufactured by the steps as described above.

<Effects>

In this embodiment, the silicon carbide semiconductor device includes the epitaxial layer 2 of a first conductivity type (n-type, for example, and the same applies hereinafter), the trench 3, the well layer 4 of a second conductivity type (p-type, for example, and the same applies hereinafter), the source region 5 of the first conductivity type, the gate oxide film 7 as a gate insulating film, the gate electrode 8, the source electrode 12, and the drain electrode 6.

The epitaxial layer 2 is formed on the silicon carbide semiconductor substrate 1 of the first conductivity type. The trench 3 is partially formed in the surface layer of the epitaxial layer 2.

The well layer 4 is formed along the side surfaces and the bottom surface of the trench 3. The source region 5 is formed in the surface layer of the well layer 4 on the bottom surface of the trench 3.

The gate oxide film 7 is formed along the side surfaces of the trench 3, and the one end of the gate oxide film 7 is formed so as to reach the source region 5.

The gate electrode 8 is formed along the side surfaces of the trench 3 and is formed on the gate oxide film 7.

The source electrode 12 is formed over the source region 5. The drain electrode 6 is formed on the back surface of the silicon carbide semiconductor substrate 1.

In addition, the gate oxide film 7 may be replaced with a gate oxide film 7b described later.

Moreover, the gate electrode 8 may be replaced with a gate electrode 8b described later.

With this configuration, the MOS channel is formed along the side surfaces of the trench 3, which can reduce the channel resistance more than that in the planar MOSFET. Furthermore, the electric field strength applied to the gate oxide film 7 can be suppressed more than that in the trench MOSFET, which increases the reliability of the gate oxide film 7.

<Second Embodiment>

Figure 2:
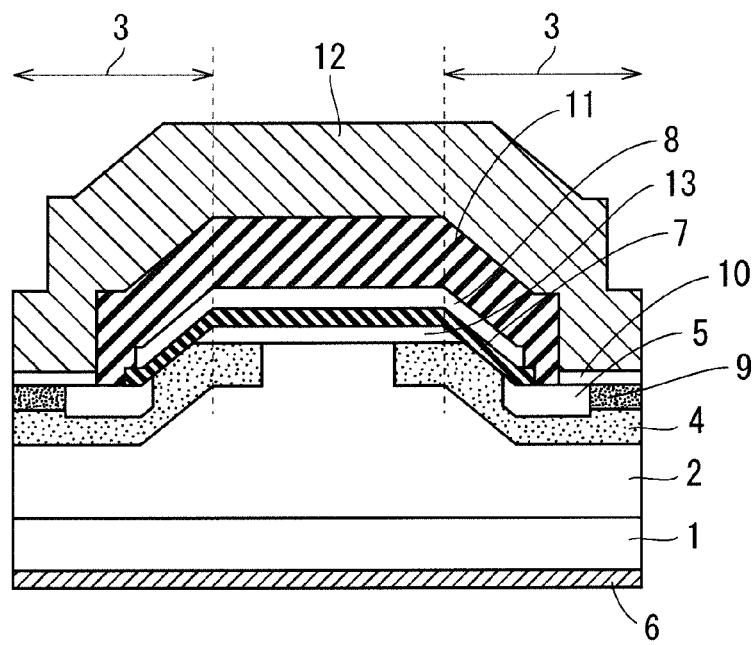
FIG. 2 is a diagram showing a cross-sectional structure of a silicon carbide semiconductor device in an embodiment.

FIG. 2 is a diagram showing a cross-sectional structure of a silicon carbide semiconductor device in this embodiment of the present invention. Descriptions are given below with reference to the diagram showing one unit cell in the active region. The same configurations as the configurations shown in FIG. 1 are denoted by the same references, and detailed descriptions of the configurations are omitted.

As shown in FIG. 2, in the silicon carbide semiconductor device in this embodiment, a surface impurity layer 13 of the n-type is formed in the surface layer of the epitaxial layer 2 in the trench non-forming region and formed in the surface layer of the well layer 4 in the trench non-forming region. The surface impurity layer 13 is an n-layer containing impurities at a concentration higher than that of the epitaxial layer 2 of the n⁻-type. Then, the gate oxide film 7 is formed on the surface impurity layer 13, and furthermore, the gate electrode 8 is formed thereon.

The surface impurity layer 13 has a thickness formed smaller than a thickness of the well layer 4, and the MOS channel has a structure in which the MOSFET channel is formed only along the side surfaces of the trench 3.

For the structure shown in FIG. 1, the MOS channel is also formed in the surface layer of the well layer 4 in the trench non-forming region, thereby increasing the channel resistance in this portion. However, for the structure shown in FIG. 2, the MOS channel is formed only along the side surfaces of the trench 3, which can further reduce the channel resistance.

The surface impurity layer 13 containing the impurities at the concentration higher than that of the epitaxial layer 2 is formed in a junction-FET (JFET) region, resulting in the merit of reducing a JEFT resistance more than that in FIG. 1.

<Effects>

In this embodiment, the well layer 4 has one end formed so as to reach the trench non-forming region in which the trench 3 is not formed in the surface layer of the epitaxial layer 2, and the gate oxide film 7 as a gate insulating film is also formed on the well layer 4 in the trench non-forming region.

The silicon carbide semiconductor device includes the surface impurity layer 13 of the first conductivity type. The surface impurity layer 13 is formed so as to reach the surface layer of the epitaxial layer 2 from the surface layer of the well layer 4 in the trench non-forming region. The surface impurity layer 13 has the impurity concentration higher than that of the epitaxial layer 2.

In addition, the gate oxide film 7 may be replaced with a gate oxide film 7b described later.

With this configuration, the MOS channel is formed only along the side surfaces of the trench 3, which can further reduce the channel resistance. Furthermore, the impurity concentration of the n-silicon carbide in the JFET region is increased, which can reduce the JFET resistance.

<Third Embodiment>

Figure 3:
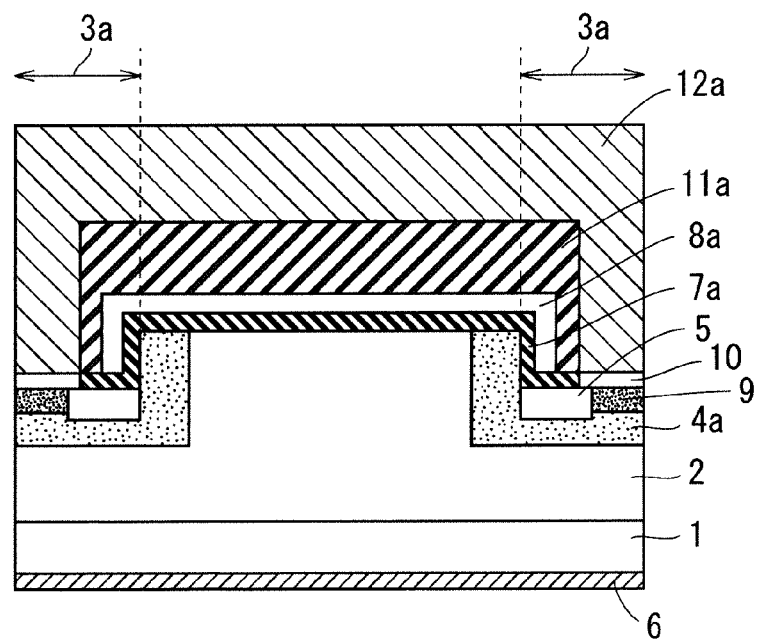
FIG. 3 is a diagram showing a cross-sectional structure of a silicon carbide semiconductor device in an embodiment.

FIG. 3 is a diagram showing a cross-sectional structure of a silicon carbide semiconductor device in this embodiment of the present invention. The same configurations as the configurations shown in FIG. 1 are denoted by the same references, and detailed descriptions of the configurations are omitted.

As shown in FIG. 3, the silicon carbide semiconductor device in this embodiment includes the silicon carbide semiconductor substrate 1 of the n⁺-type and the epitaxial layer 2 of the n⁻ silicon carbide epitaxially grown on the silicon carbide semiconductor substrate 1 of the n⁺-type, and a trench 3a is formed in the surface layer of the epitaxial layer 2. The trench 3a shown in FIG. 3 has side surfaces formed in a direction orthogonal to the surface of the epitaxial layer 2.

A well layer 4a of the p-type is formed in the surface layer of the epitaxial layer 2 in which the trench 3a is formed. In other words, the well layer 4a is formed along the bottom surface and the side surfaces of the trench 3a. The well layer 4a may be formed in a region (trench non-forming region) in which the trench 3a is not formed in the surface layer of the epitaxial layer 2.

The source region 5 and the contact region 9 of the p-type are partially formed in a surface layer of the well layer 4a. Further, the silicide film 10 is formed so as to cover part of the source region 5 and the contact region 9. The source region 5, the contact region 9, and the silicide film 10 are formed on the bottom surface of the trench 3a.

A gate electrode 8a is formed on the well layer 4a with a gate oxide film 7a therebetween, the well layer 4a being formed along the side surfaces of the trench 3a. The gate oxide film 7a and the gate electrode 8a may also be formed in the trench non-forming region. For the case shown in FIG. 3, the gate oxide film 7a and the gate electrode 8a are formed in the trench non-forming region.

An interlayer insulating film 11a is formed so as to cover the gate oxide film 7a, the gate electrode 8a, and the source region 5 that is not covered with the silicide film 10. Further, a source electrode 12a is formed so as to cover the silicide film 10 and the interlayer insulating film 11a.

Moreover, the drain electrode 6 is formed on the back surface side of the silicon carbide semiconductor substrate 1.

The MOS channel is formed in the side surfaces of the trench 3a by application of voltage to the gate electrode 8a. The MOS channel is formed in a plane along the side surfaces of the trench 3a, namely, a plane orthogonal to a (0001) plane, which can greatly reduce the channel resistance more than that in the planar MOSFET. Furthermore, the electric field strength applied to the gate oxide film 7a can be suppressed more than that in the trench MOSFET, which increases reliability of the gate oxide film 7a.

<Effects>

In this embodiment, the trench 3a has the side surfaces formed in the direction orthogonal to the surface of the epitaxial layer 2.

With this configuration, the MOS channel is formed in the plane along the side surfaces of the trench 3a, namely, the plane orthogonal to the (0001) plane, which can greatly reduce the channel resistance more than that in the planar MOSFET.

<Fourth Embodiment>

Figure 4:
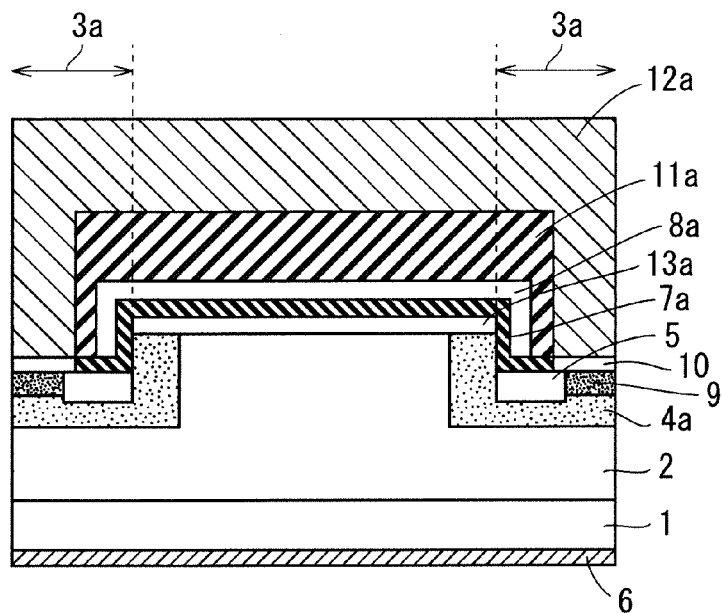
FIG. 4 is a diagram showing a cross-sectional structure of a silicon carbide semiconductor device in an embodiment.

FIG. 4 is a diagram showing a cross-sectional structure of a silicon carbide semiconductor device in this embodiment of the present invention. The same configurations as the configurations shown in FIG. 3 are denoted by the same references, and detailed descriptions of the configurations are omitted.

As shown in FIG. 4, in the silicon carbide semiconductor device in this embodiment, a surface impurity layer 13a of the n-type is formed in the surface layer of the epitaxial layer 2 in the trench non-forming region and the surface layer of the well layer 4a in the trench non-forming region.

For the structure shown in FIG. 3, the MOS channel is also formed in the surface layer of the well layer 4a in the trench non-forming region, thereby increasing the channel resistance in this portion. However, for the structure shown in FIG. 4, the MOS channel is formed only along the side surfaces of the trench 3a, which can further reduce the channel resistance.

<Effects>

In this embodiment, the silicon carbide semiconductor device includes the surface impurity layer 13a of the first conductivity type. The surface impurity layer 13a is formed so as to reach the surface layer of the epitaxial layer 2 from the surface layer of the well layer 4a in the trench non-forming region. The surface impurity layer 13a has the impurity concentration higher than that of the epitaxial layer 2.

With this configuration, the MOS channel is formed only along the side surfaces of the trench 3a, which can further reduce the channel resistance. Furthermore, the impurity concentration of the n-silicon carbide in the JFET region is increased, which can reduce the JFET resistance.

A trench in the following embodiments is described as a trench having side surfaces at an angle of inclination with respect to the surface of the epitaxial layer 2, and a trench having side surfaces formed in the direction orthogonal to the surface of the epitaxial layer 2 is also applicable.

<Fifth Embodiment>

Figure 5:
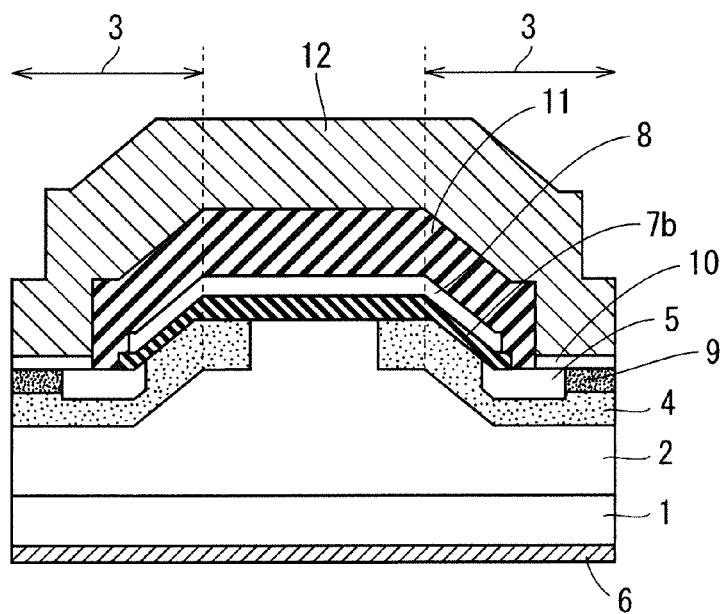
FIG. 5 is a diagram showing a cross-sectional structure of a silicon carbide semiconductor device in an embodiment.

FIG. 5 is a diagram showing a cross-sectional structure of a silicon carbide semiconductor device in this embodiment of the present invention. The same configurations as the configurations shown in FIG. 1 are denoted by the same references, and detailed descriptions of the configurations are omitted.

As shown in FIG. 5, a gate oxide film 7b of the silicon carbide semiconductor device in this embodiment has different thicknesses of a portion formed along the side surfaces of the trench 3 and of a portion formed on the well layer 4 in the trench non-forming region and on the epitaxial layer 2 in the trench non-forming region. Specifically, the portion formed on the well layer 4 in the trench non-forming region and on the epitaxial layer 2 in the trench non-forming region has the thickness formed greater than the thickness of the portion formed along the side surfaces of the trench 3. Using the silicon carbide semiconductor substrate 1 being a C surface, for example, allows the gate oxide film 7b to have the portion on the well layer 4 in the trench non-forming region and on the epitaxial layer 2 in the trench non-forming region formed greater in thickness than the portion formed along the side surfaces of the trench 3 by exploiting anisotropy of a thermal oxidation rate.

The electric field applied to the gate oxide film 7b is the highest in the midsection of the JFET region (midsection of the trench non-forming region). The gate oxide film 7b in this portion is formed great in thickness, which can increase the reliability of the gate oxide film 7b. A gate capacitance can also be reduced.

<Effects>

In this embodiment, the one end of the well layer 4 is formed so as to reach the trench non-forming region in which the trench 3 is not formed in the surface layer of the epitaxial layer 2, and the gate oxide film 7b as a gate insulating film is also formed on the well layer 4 in the trench non-forming region.

The gate oxide film 7b has the thickness of the portion formed on the well layer 4 in the trench non-forming region greater than the thickness of the portion formed along the side surfaces of the trench 3.

With this configuration, the gate oxide film 7b in the midsection of the JFET region is formed great in thickness, which can increase the reliability of the gate oxide film 7b. The gate capacitance can be reduced.

<Sixth Embodiment>

Figure 6:
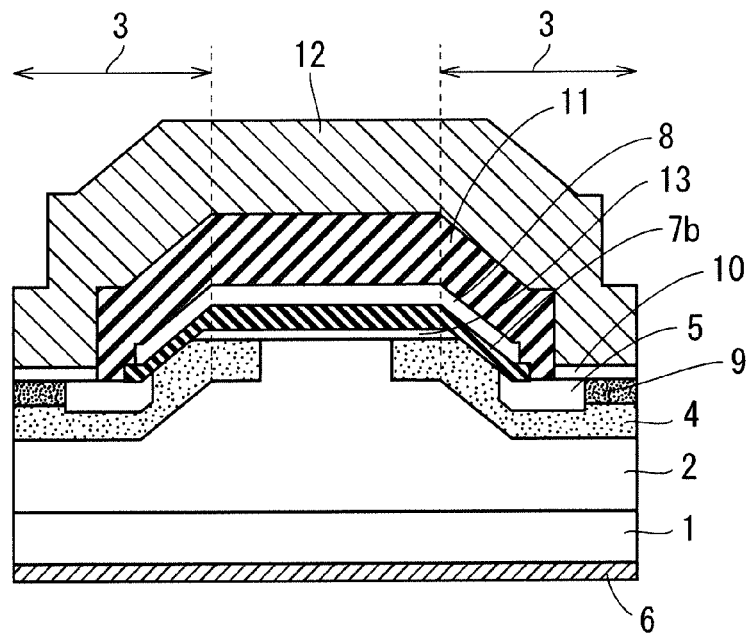
FIG. 6 is a diagram showing a cross-sectional structure of a silicon carbide semiconductor device in an embodiment.

FIG. 6 is a diagram showing a cross-sectional structure of a silicon carbide semiconductor device in this embodiment of the present invention. The same configurations as the configurations shown in FIG. 5 are denoted by the same references, and detailed descriptions of the configurations are omitted.

As shown in FIG. 6, in the silicon carbide semiconductor device in this embodiment, a surface impurity layer 13 of the n-type is formed in the surface layer of the epitaxial layer 2 in the trench non-forming region and in the surface layer of the well layer 4 in the trench non-forming region.

For the structure shown in FIG. 5, the MOS channel is also formed in the surface layer of the well layer 4 in the trench non-forming region, thereby increasing the channel resistance in this portion. However, for the structure shown in FIG. 6, the MOS channel is formed only along the side surfaces of the trench 3, which can further reduce the channel resistance.

<Effects>

In this embodiment, the silicon carbide semiconductor device includes the surface impurity layer 13 of the first conductivity type. The surface impurity layer 13 is formed so as to reach the surface layer of the epitaxial layer 2 from the surface layer of the well layer 4 in the trench non-forming region. The surface impurity layer 13 has the impurity concentration higher than that of the epitaxial layer 2.

With this configuration, the MOS channel is formed only along the side surfaces of the trench 3, which can further reduce the channel resistance. Furthermore, the impurity concentration of the n-silicon carbide in the JFET region is increased, which can reduce the JFET resistance.

<Seventh Embodiment>

Figure 7:
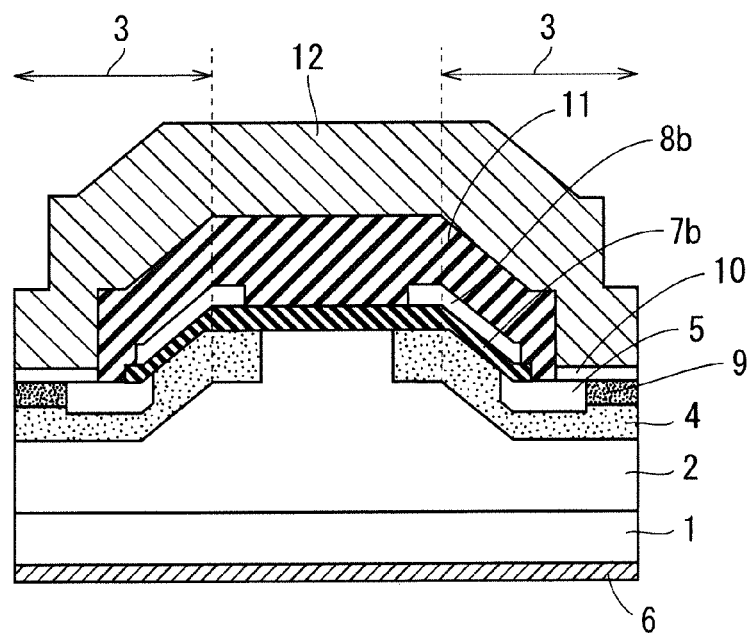
FIG. 7 is a diagram showing a cross-sectional structure of a silicon carbide semiconductor device in an embodiment.

FIG. 7 is a diagram showing a cross-sectional structure of a silicon carbide semiconductor device in this embodiment of the present invention. The same configurations as the configurations shown in FIG. 5 are denoted by the same references, and detailed descriptions of the configurations are omitted.

As shown in FIG. 7, a gate electrode 8b is formed in the silicon carbide semiconductor device in this embodiment. The gate electrode 8b is not formed at least in the midsection of the JFET region. The gate electrode 8b shown in FIG. 7 is not formed on part of the well layer 4 in the trench non-forming region and on the epitaxial layer 2 in the trench non-forming region while the gate electrode 8b is formed on the other part of the well layer 4 in the trench non-forming region and on the well layer 4 formed along the side surfaces of the trench 3.

The electric field applied to the gate oxide film 7b is the highest in the midsection of the JFET region (midsection of the trench non-forming region). The gate electrode 8b is not formed in this portion, which allows the electric field strength applied to the gate oxide film 7b to be suppressed. Moreover, the well layer 4 is formed below end portions of the gate electrode 8b, which allows the electric field strength applied to the gate oxide film 7b below the end portions of the gate electrode 8b to be suppressed low. This can increase the reliability of the gate oxide film 7b. The gate capacitance can also be reduced.

The gate oxide film 7b is included in FIG. 7, but the gate oxide film 7 may be included instead. FIG. 7 shows the structure in which the well layer 4 extends farther than the gate electrode 8b to the midsection (midsection of the trench non-forming region), but it may be a structure in which the gate electrode 8b extends farther than the well layer 4 to the midsection (midsection of the trench non-forming region).

<Effects>

In this embodiment, the gate electrode 8b is not formed on the epitaxial layer 2 in which the well layer 4 is not formed in the trench non-forming region.

With this configuration, the gate electrode is not formed in the midsection of the JFET region, which allows the electric field strength applied to the gate oxide film 7b to be suppressed. Moreover, the well layer 4 is formed below the end portions of the gate electrode 8b, which allows the electric field strength applied to the gate oxide film 7b below the end portions of the gate electrode 8b to be suppressed low. This can increase the reliability of the gate oxide film 7b. The gate capacitance can also be reduced.

<Eighth Embodiment>

Figure 8:
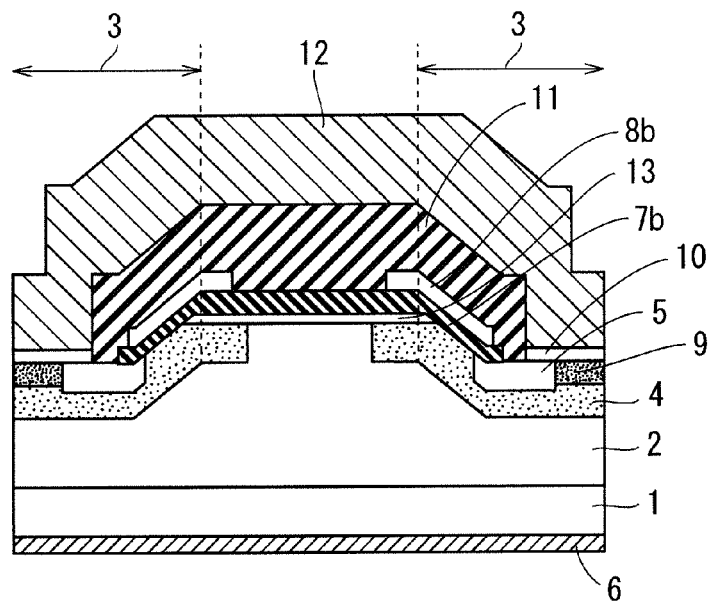
FIG. 8 is a diagram showing a cross-sectional structure of a silicon carbide semiconductor device in an embodiment.

FIG. 8 is a diagram showing a cross-sectional structure of a silicon carbide semiconductor device in this embodiment of the present invention. The same configurations as the configurations shown in FIG. 7 are denoted by the same references, and detailed descriptions of the configurations are omitted.

As shown in FIG. 8, in the silicon carbide semiconductor device in this embodiment, a surface impurity layer 13 of the n-type is formed in the surface layer of the epitaxial layer 2 in the trench non-forming region and in the surface layer of the well layer 4 in the trench non-forming region.

For the structure shown in FIG. 7, the MOS channel is also formed in the surface layer of the well layer 4 in the trench non-forming region, thereby increasing the channel resistance in this portion. However, for the structure shown in FIG. 8, the MOS channel is formed only along the side surfaces of the trench 3, which can further reduce the channel resistance. FIG. 8 shows the structure in which the well layer 4 extends farther than the gate electrode 8b to the midsection (midsection of the trench non-forming region), but it may be a structure in which the gate electrode 8b extends farther than the well layer 4 to the midsection (midsection of the trench non-forming region).

<Effects>

In this embodiment, the silicon carbide semiconductor device includes the surface impurity layer 13 of the first conductivity type. The surface impurity layer 13 is formed so as to reach the surface layer of the epitaxial layer 2 from the surface layer of the well layer 4 in the trench non-forming region. The surface impurity layer 13 has the impurity concentration higher than that of the epitaxial layer 2.

With this configuration, the MOS channel is formed only along the side surfaces of the trench 3, which can further reduce the channel resistance. Furthermore, the impurity concentration of the n-silicon carbide in the JFET region is increased, which can reduce the JFET resistance.

<Ninth Embodiment>

Figure 9:
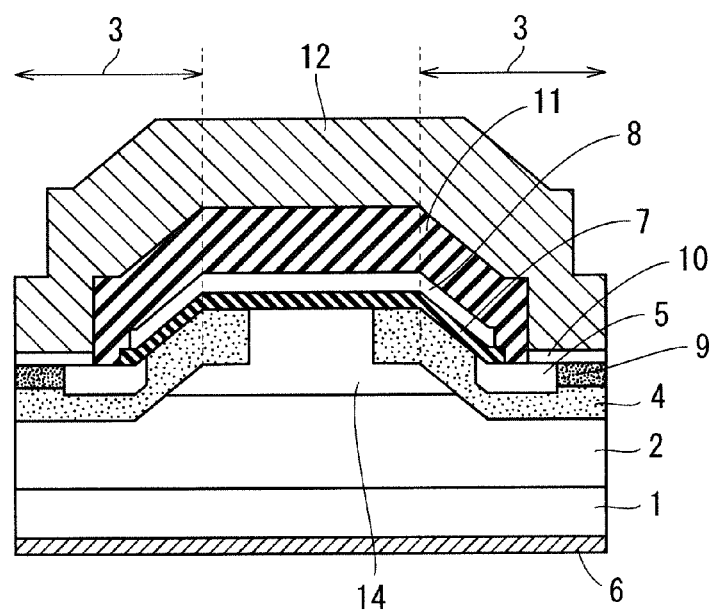
FIG. 9 is a diagram showing a cross-sectional structure of a silicon carbide semiconductor device in an embodiment.

FIG. 9 is a diagram showing a cross-sectional structure of a silicon carbide semiconductor device in this embodiment of the present invention. The same configurations as the configurations shown in FIG. 1 are denoted by the same references, and detailed descriptions of the configurations are omitted.

As shown in FIG. 9, a top impurity layer 14 is formed on the side surfaces of the trench 3 and in a top layer of the epitaxial layer 2 in the trench non-forming region in the silicon carbide semiconductor device in this embodiment. The top impurity layer 14 is an n-layer containing impurities at the concentration higher than that of the epitaxial layer 2. The well layer 4 in the JFET region is formed in a surface layer of the top impurity layer 14, and the gate oxide film 7 is formed so as to cover the top impurity layer 14.

The top impurity layer 14 has a thickness formed greater than the thickness of the well layer 4 in the JFET region. This can greatly reduce the JFET resistance more than that in FIG. 1. The top impurity layer 14 is formed shallower than the well layer 4 on the bottom surface of the trench 3, so that electric field strength applied to an end portion of the well layer 4 on the bottom surface of the trench 3 can be suppressed low at the time of reverse bias.

The gate oxide film 7 is included in FIG. 9, but the gate oxide film 7b may be included instead. The gate electrode 8 is included in FIG. 9, but the gate electrode 8b may be included instead.

<Effects>

In this embodiment, the one end of the well layer 4 is formed so as to reach the trench non-forming region in which the trench 3 is not formed in the surface layer of the epitaxial layer 2, and the gate oxide film 7 as a gate insulating film is also formed on the well layer 4 in the trench non-forming region.

The silicon carbide semiconductor device includes the top impurity layer 14 of the first conductivity type. The top impurity layer 14 is formed on the side surfaces of the trench 3 and in the top layer of the epitaxial layer 2 in the trench non-forming region. The top impurity layer 14 has the impurity concentration higher than that of the epitaxial layer 2 and has the thickness formed greater than that of the well layer 4.

In addition, the gate oxide film 7 may be replaced with the gate oxide film 7b.

With this configuration, the top impurity layer 14 having the high impurity concentration is formed in the JFET region, which can greatly reduce the JEFT resistance.

The top impurity layer 14 is formed shallower than the well layer 4 on the bottom surface of the trench 3, so that the electric field strength applied to the end portion of the well layer 4 on the bottom surface of the trench 3 can be suppressed low at the time of reverse bias.

<Tenth Embodiment>

Figure 10:
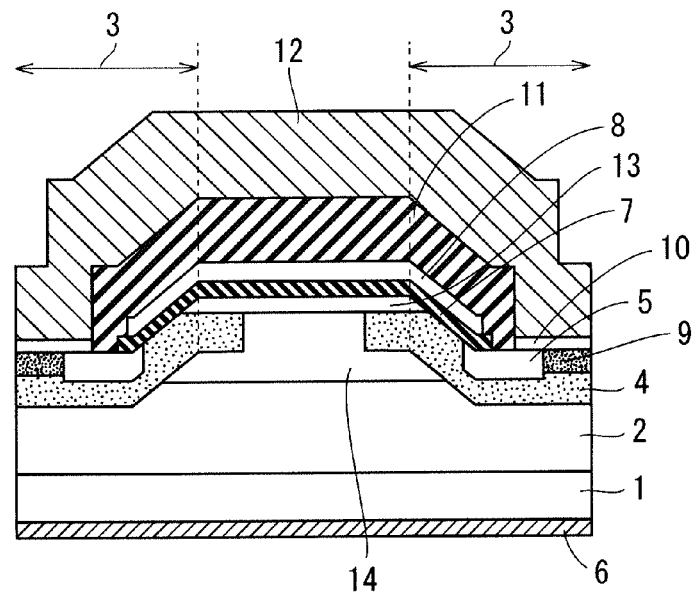
FIG. 10 is a diagram showing a cross-sectional structure of a silicon carbide semiconductor device in an embodiment.

FIG. 10 is a cross-sectional structure of a silicon carbide semiconductor device in this embodiment of the present invention. The same configurations as the configurations shown in FIG. 9 are denoted by the same references, and detailed descriptions of the configurations are omitted.

As shown in FIG. 10, a surface impurity layer 13 of the n-type is formed on the top impurity layer 14 and in the surface layer of the well layer 4 in the trench non-forming region in the silicon carbide semiconductor device in this embodiment.

For the structure shown in FIG. 9, the MOS channel is also formed in the surface layer of the well layer 4 in the trench non-forming region, thereby increasing the channel resistance in this portion. However, for the structure shown in FIG. 10, the MOS channel is formed only along the side surfaces of the trench 3, which can further reduce the channel resistance.

<Effects>

In this embodiment, the silicon carbide semiconductor device includes the surface impurity layer 13 of the first conductivity type. The surface impurity layer 13 is formed so as to reach the surface layer of the top impurity layer 14 from the surface layer of the well layer 4 in the trench non-forming region. The surface impurity layer 13 has the impurity concentration higher than that of the epitaxial layer 2.

With this configuration, the MOS channel is formed only along the side surfaces of the trench 3, which can further reduce the channel resistance. Furthermore, the impurity concentration of the n-silicon carbide in the JFET region is increased, which can reduce the JFET resistance.

Although the materials of the respective components, the conditions of implementation, and the like, are described in the embodiments, the forgoing description is illustrative and not restrictive.

In addition, according to the present invention, the above embodiments can be freely combined, or each embodiment can be freely varied or omitted within the scope of the invention.

While the invention has been shown and described in detail, the foregoing description is in all aspects illustrative and not restrictive. The present invention is not restricted thereto. It is therefore understood the numerous modifications and variations can be devised without departing from the scope of the invention.

DESCRIPTION OF NUMERALS 1 silicon carbide semiconductor substrate; 2 epitaxial layer; 3, 3a, 3c trench; 4, 4a, 4c well layer; 5 source region; 6 drain electrode; 7, 7a, 7b, 7c, 7d gate oxide film; 8, 8a, 8b, 8c, 8d gate electrode; 9 contact region; 10 silicide film; 11, 11a, 11c interlayer insulating film; 12, 12a, 12c source electrode; 13, 13a surface impurity layer; 14 top impurity layer; 20 resist.

The invention claimed is:

1. A silicon carbide semiconductor device, comprising:
an epitaxial layer of a first conductivity type formed on a silicon carbide semiconductor substrate of the first conductivity type;
a trench partially formed in a surface layer of said epitaxial layer;
a well layer of a second conductivity type formed along side surfaces and a bottom surface of said trench;
a source region of the first conductivity type formed in a surface layer of said well layer on the bottom surface of said trench;
a gate insulating film that is formed along the side surfaces of said trench and has one end formed so as to reach said source region;
a gate electrode formed along the top of said trench, extending downward onto the side surfaces of said trench, and formed on said gate insulating film;
a source electrode formed over said source region; and
a drain electrode formed on a back surface of said silicon carbide semiconductor substrate, wherein
the one end of said well layer is formed so as to reach a trench non-forming region in which said trench is not formed in the surface layer of said epitaxial layer,
said gate insulating film is also formed on said well layer in said trench non-forming region, and
said gate insulating film has a thickness of a portion formed on said well layer in said trench non-forming region greater than a thickness of a portion formed along the side surfaces of said trench.

2. The silicon carbide semiconductor device according to claim 1, wherein
said well layer has one end formed so as to reach a trench non-forming region in which said trench is not formed in the surface layer of said epitaxial layer,
said gate insulating film is also formed on said well layer in said trench non-forming region,
the silicon carbide semiconductor device further comprises a surface impurity layer of the first conductivity type formed so as to reach the surface layer of said epitaxial layer from the surface layer of said well layer in said trench non-forming region, and
said surface impurity layer has an impurity concentration higher than that of said epitaxial layer.

3. The silicon carbide semiconductor device according to claim 1, wherein
the one end of said well layer is formed so as to reach a trench non-forming region in which said trench is not formed in the surface layer of said epitaxial layer,
said gate insulating film is also formed on said well layer in said trench non-forming region,
the silicon carbide semiconductor device further comprises a top impurity layer of the first conductivity type formed on the side surfaces of said trench and in a top layer of said epitaxial layer in said trench non-forming region, and
said top impurity layer has an impurity concentration higher than that of said epitaxial layer and has a thickness formed greater than that of said well layer.

4. The silicon carbide semiconductor device according to claim 1, wherein the side surfaces of said trench are formed in a direction orthogonal to a surface of said epitaxial layer.

5. The silicon carbide semiconductor device according to claim 1, wherein said gate electrode is also formed on said well layer in a trench non-forming region in which said trench is not formed in the surface layer of said epitaxial layer.

6. A silicon carbide semiconductor device, comprising:
an epitaxial layer of a first conductivity type formed on a silicon carbide semiconductor substrate of the first conductivity type;
a trench partially formed in a surface layer of said epitaxial layer;
a well layer of a second conductivity type formed along side surfaces and a bottom surface of said trench;
a source region of the first conductivity type formed in a surface layer of said well layer on the bottom surface of said trench;
a gate insulating film that is formed along the side surfaces of said trench and has one end formed so as to reach said source region;
a gate electrode formed along the top of said trench, extending downward onto the side surfaces of said trench, and formed on said gate insulating film;
a source electrode formed over said source region; and
a drain electrode formed on a back surface of said silicon carbide semiconductor substrate, wherein
said gate electrode is not formed on said epitaxial layer in which said well layer is not formed in a trench non-forming region in which said trench is not formed in the surface layer of said epitaxial layer.

\* \* \* \* \*